United States Patent [19]
Ozdemir et al.

[11] Patent Number: 5,391,909
[45] Date of Patent: Feb. 21, 1995

[54] DETECTION OF ELECTRON-BEAM SCANNING OF A SUBSTRATE

[75] Inventors: Faik S. Ozdemir, Thousand Oaks; Richard B. Cottine, Encinitas, both of Calif.

[73] Assignee: Hughes Aircraft Company, Los Angeles, Calif.

[21] Appl. No.: 959,833

[22] Filed: Oct. 13, 1992

[51] Int. Cl.⁶ .............................................. G11C 13/00
[52] U.S. Cl. .................................. 257/429; 257/917; 365/118
[58] Field of Search ............... 257/429, 917, 431, 443, 257/444, 447, 458; 365/118

[56] References Cited

U.S. PATENT DOCUMENTS

| | | | |
|---|---|---|---|
| 3,428,850 | 2/1969 | Crowell et al. | 365/118 |
| 3,721,962 | 3/1973 | Foster et al. | 365/118 |
| 3,736,571 | 5/1973 | Cohen et al. | 365/118 |
| 4,079,358 | 3/1978 | Arntz | 365/118 |
| 4,247,859 | 1/1981 | Rai-Choudhury et al. | 257/352 |
| 4,396,996 | 8/1983 | Oldham | 365/118 |

OTHER PUBLICATIONS

"Electron–Beam Customization, Repair, and Testing of the Wafer–Scale Circuits", Solid State Technology, Feb. 1984, pp. 135–139, Shaver.

"Use of E–Beam for Random Access Read and Write of Digital Test Signals", 1984 IEEE Int'l Solid–State Circuits Conf, pp. 22–23, 310, Jensen et al.

*Primary Examiner*—Sara W. Crane
*Attorney, Agent, or Firm*—V. D. Duraiswamy; W. K. Denson-Low

[57] ABSTRACT

The scanning of an operating integrated circuit (IC) substrate by an electron (e)-beam is detected by providing conductive plates in the substrate, and triggering a charge-sensitive mechanism such as a field effect transistor (FET) when an e-beam has scanned over the plate. The plates can be fabricated at different levels within the substrate, with a lower plate preferably shaded from the e-beam by an upper plate and providing a reference for the upper plate. E-beam detection occurs either through the positive or negative charging of capacitances associated with the FETs, or from instantaneous negative or positive current flows from the detector plates; a latch is actuated to hold an instantaneously detected current level exceeding a predetermined threshold. The logic state of this latch can be used to modify the functional operation of the IC in real time.

8 Claims, 3 Drawing Sheets

DETECTION OF ELECTRON-BEAM SCANNING OF A SUBSTRATE

BACKGROUND OF THE INVENTION

1. Field of the Invention

This invention relates to the detection of electron (e)-beam scanning of a substrate.

2. Description of the Related Art

There are numerous instances in which an electrical circuit chip is scanned by an e-beam, generally with the use of a scanning electron microscope (SEM). E-beam scanning is used for trouble shooting problems with the circuitry, the injection of information at desired locations, voltage contrast analysis, quality control to determine whether the circuitry is functioning properly, and the measurement of line widths. The scanning is normally accomplished with a raster-type scan covering the full circuit area, although in certain instances the illumination of the substrate may be restricted to smaller designated portions of the circuitry.

One prior technique, referred to as "e-beam reconfiguration", uses an e-beam to reconfigure the circuit connections within an IC. This technique is described in Shaver, "Electron-Beam Customization, Repair, and Testing of the Wafer-Scale Circuits", *Solid State Technology*, February 1984, pages 135-139, and in Jensen et al., "Use of E-Beam for Random Access Read and Write of Digital Test Signals", 1984 *IEEE Int'l. Solid-State Circuits Conf.*, pages 22-23, 310. It employs a number of redundant circuits that can be connected into or out of the main circuitry by flip-flop switches. Each flip-flop has two possible states, one of which connects a redundant circuit into the main circuitry and the other of which excludes the redundant circuit. A pair of e-beam sensitive diodes are provided for each flip-flop circuit, one to set the flip-flop in one state and the other to set the flip-flop in its other state. A small surface metallization is provided for each diode; directing an e-beam onto the metallization for a given diode produces a current flow through the diode and into the gate of one of the flip-flop transistors, causing the flip-flop to change state. The structure is designed so that it is necessary for the e-beam to dwell upon a surface diode metallization for a sufficient period of time to inject enough charge to actuate the flip-flop; this is not a problem because the locations of the diode metallizations are known, and the e-beam can be accurately directed to them.

In contrast to the e-beam reconfiguration technique in which the e-beam is held stationary at a known location on the substrate, it would be desirable to be able to detect when an e-beam is being scanned across the surface of an IC substrate. No systems are presently known that provide for the detection of a scanning e-beam. Furthermore, in some instances the upper surface of an IC substrate may be removed before an e-beam scan is performed, and in this event even the surface metallization used to capture electrons in the e-beam reconfiguration technique would no longer be available.

SUMMARY OF THE INVENTION

The present invention seeks to provide a system for detecting the scanning of an IC substrate by an e-beam, even if the upper layers of the substrate have been removed, with a reliable detection mechanism that has the capability of canceling the effects of circuit induced noise.

These goals are accomplished by providing the substrate with an array of e-beam scan detector devices, and a mechanism that is responsive to the detection of e-beam scanning to produce an indication that such scanning has occurred. The detectors are preferably implemented as conductive plates located at different depths within the substrate. An indication of e-beam scanning is produced when the charge applied to one or more of the plates from a scan exceeds a predetermined threshold level.

Scanning can be detected by accumulating the net charge applied to a plate over time, such as with the use of a capacitor, and by providing a scan indication when the accumulated charge exceeds the threshold. Alternately, when the e-beam scan produces an initial negative charging of a plate followed by a positive-going charging from secondary electron emissions, a more instantaneous scan detection is achieved by latching the detection of an e-beam in substantially less time than the time necessary for the secondary electron emissions to neutralize the initial negative charging. Scan indications from either the negative or positive-going portions of the charging cycle can be realized with the use of n-channel/p-channel FET pairs for corresponding pairs of detector plates.

A reliable reference for the scanning of a detector plate at one level within the IC is provided by referencing that plate to a second plate at a different level, such that only one of the plates is effected by a scanning e-beam. A secure differential between the two plates is achieved by positioning the upper plate so that it shades the lower plate from a scanning beam. The charges from different plates at the same level can also be combined, such as by a charge-coupled device (CCD), to provide a higher degree of sensitivity.

These and other features and advantages of the invention will be apparent to those skilled in the art from the following detailed description, taken together with the accompanying drawings.

DETAILED DESCRIPTION OF THE INVENTION

Figure 1:
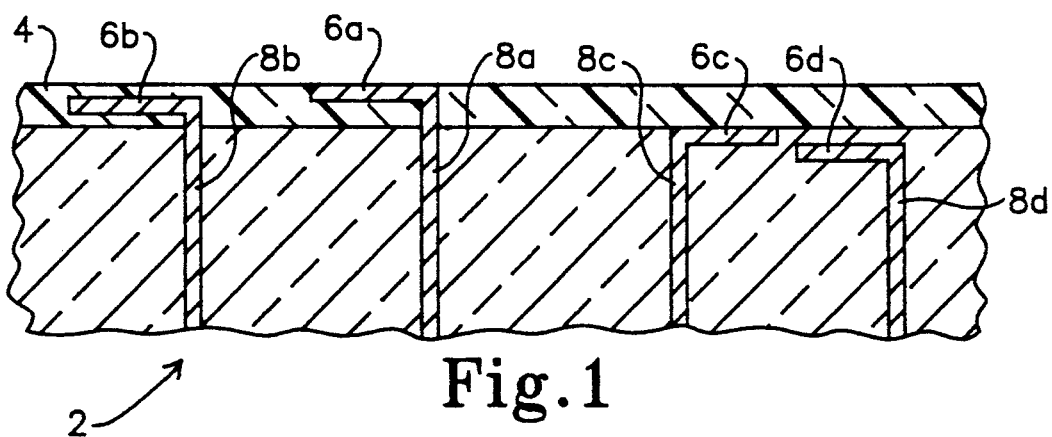
FIG. 1 is a sectional view of an IC substrate illustrating the use of e-beam scan detectors in accordance with the invention.

A structure for detecting the scanning of a substrate by an e-beam is shown somewhat schematically and in simplified form in FIG. 1. A semiconductor substrate 2 upon which integrated circuitry (not shown) is formed is typically capped by a passivating insulating layer 4 of $SiO_2$ or $SiNO_4$. The detection of electron beam scanning can be accomplished in accordance with the invention by providing a metallic plate 6a that is embedded into the passivation layer's upper surface, with a downward extending lead 8a connecting the plate to circuitry (not shown) that produces an appropriate indication when an e-beam scan has been detected by the plate. The plate 6a is preferably formed from the same metal as that used for the metallized connectors of the IC. Its thickness is typically about 0.7-1 micron, which corresponds to the typical thickness of an IC upper layer metallization.

The object of the plate is to capture electrons from an e-beam scan so as to charge its associated circuitry to produce an indication that a scan has occurred. The size of the plate depends upon a number of factors, some of which are conflicting and require a trade-off to be made. One criterion is that the plate needs to be large enough to effectively collect sufficient electrons to actuate the circuitry. Unlike the prior e-beam reconfiguration technique in which relatively large beam currents on the order of tens to hundreds of nanoamps are employed for the stationary beam, the e-beam scanning for which the present invention is intended can have much lower beam currents, down to the order of a single nanoamp. Compounding this much lower beam current is the fact that the e-beam dwell time at any given location on the substrate during a raster scan is very small compared to the stationary beam dwell time used in e-beam reconfiguration. Countering this is the fact that, with the reduced size of present transistor devices that can be used to detect a current acquired by the plate, fewer electrons are necessary to actuate the transistors. Currently available field effect transistors (FETs) have gate lengths on the order of 2 microns and gate widths on the order of 2-4 microns; state of the art devices have gate dimensions on the order of $1 \times 2-3$ microns. Also, the line widths of metallized interconnects have currently been reduced to the order of 3-4 microns.

It has been found that, with currently available IC dimensions, electron collector plates with widths equal to or even less than the width of the IC interconnect metallization can be used to effectively detect a scanning e-beam. The plate length can be made greater than its width, preferably on the order of about 10-15 microns, to enhance the electron collection. In addition to using up less area or "real estate" on the chip, the use of small collector plates on this order of magnitude reduces capacitive coupling to surrounding and underlying circuitry, making the e-beam detection apparatus less sensitive to false triggering from normal circuit activity.

The typical energy of an e-beam used in IC diagnostics is about 1-30 keV. When an e-beam within this energy range impacts upon the upper surface of an IC substrate, some of the incoming electrons (referred to as the primary electrons) penetrate into the upper surface, typically to a depth of from a few tenths of a micron to several microns. An electron collector plate 6b that is fabricated with its upper surface within this depth range is shown to the left of plate 6a, with a lead 8b extending down to the underlying circuitry. A plate at this depth will also be sensitive to an e-beam scan, and is somewhat less subject to backscattering.

The invention also includes the provision of electron collection plates at various depths within the substrate that are not penetrated by an e-beam scanned over the upper substrate surface. Such a plate is identified as 6c, located immediately below the passivation layer 4. If the passivation layer is stripped away prior to the e-beam scan (or if a first scan is performed on the passivation layer followed by stripping that layer away and then performing a second scan), the initially buried plate 6c will collect electrons from the scanning and transmit them to the underlying circuitry via connector 8c. In a manner similar to plate 6b, a second electron collection plate 6d can be fabricated slightly below the level of plate 6c so as to capture primary electrons impinging on the substrate surface below the passivation layer, and transmit them to the underlying circuitry via lead 8d.

Figure 2:
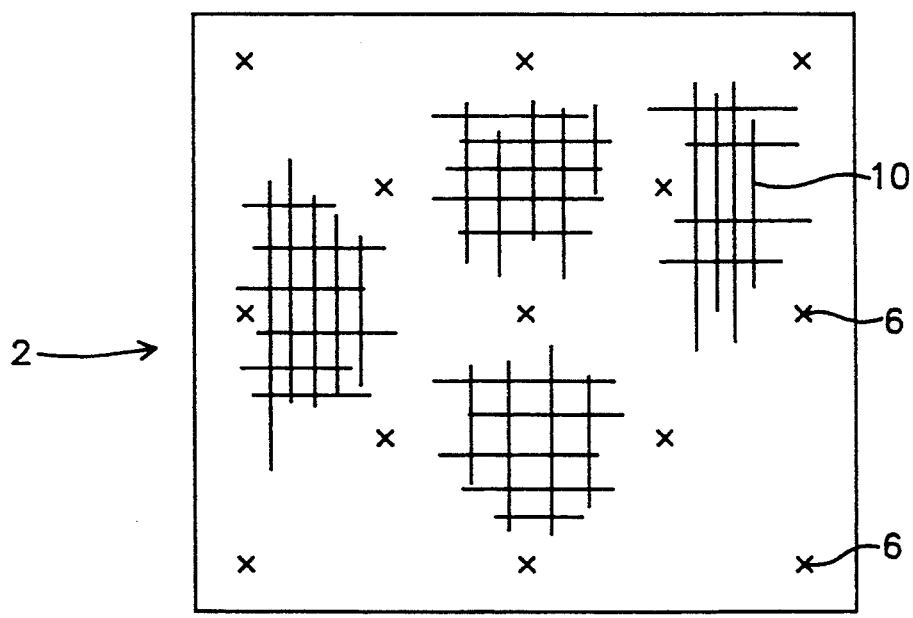
FIG. 2 is a plan view of an IC substrate illustrating an array of e-beam scan detector locations.

FIG. 2 is an illustrative plan view showing a layout of electron collector plate 6 (indicated by x's) on the substrate 2. The plates are intermixed with the integrated circuitry 10 on the chip. With several detector plates provided at each metallization level within the chip, a redundant detection capability is provided that increases the likelihood of successful detection. The preferably elongate detector plates may be oriented at right angles to each so that detection will occur when the chip is e-beam raster scanned, regardless of the direction in which the scanning occurs relative to the chip.

When an e-beam within the typically scanning energy of 1-30 keV strikes the upper surface of an IC chip, a number of different effects are produced that can result in either a negative or a positive charging. Primary electrons from the beam penetrate into the structures which compose the IC surface, usually to a depth of a few tenths of a micron to several microns; other beam electrons are backscattered back into the vacuum with energies very close to that of the primary electrons that enter the substrate. Finally, the primary electrons generate secondary electrons from the substrate material at or near the surface. The secondary electrons are emitted into the vacuum a brief time after the e-beam impact, typically on the order of nanoseconds to microseconds. They have very low energies, typically a few eVs, and are detected by the SEM.

Figure 3:
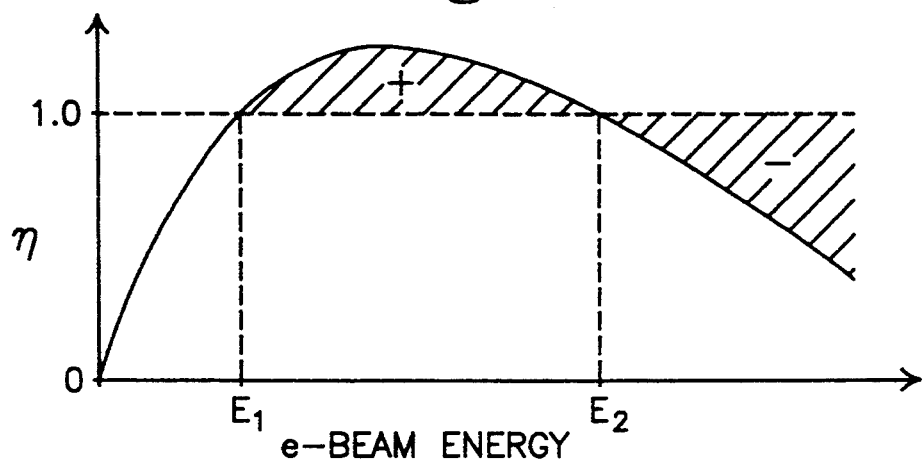
FIGS. 3 and 4 are graphs of the secondary electron emission ratio as a function of e-beam energy, and of the induced current in an e-beam detector as a function of time, respectively.

FIG. 3 illustrates a quantity known as the "secondary electron yield" ($\eta$), which is defined as the ratio of secondary to primary electrons, as a function of the e-beam energy. If $\eta$ is greater than 1, a net positive charge is injected into the surface; if $\eta$ is less than one a net negative charge is injected; at $\eta = 1$ no net charge is injected. The value of $\eta$ initially rises with the beam energy until it crosses the $\eta = 1$ value at a beam energy E1 which is referred to as the "first cross-over". It continues rising with the beam energy until a maximum is reached, and then falls back to again intersect the $\eta = 1$ level at a beam energy E2, referred to as the "second cross-over". At beam energies greater than E2 the value of $\eta$ continues to progressively decline.

The exact value of $\eta$ for any given beam energy depends upon the composition of the substrate material. However, in all practical scanning e-beam systems the beam energy will be greater than E1, but may be either greater or less than E2. The beam operator will generally attempt to tune the scanning apparatus so as to operate very close to E2. However, if the actual operating point is offset significantly from E2, either a net negative or a net positive charge will be injected into the e-beam detector plates. This is not an instantaneous charge, since a slight delay is required for the emission of secondary electrons after the primary electrons have impacted the surface, but represents the net charge accumulated over time from the initial e-beam impact through the emission of the second electrons. As explained below, the present invention is sensitive to either positive or negative net charges accumulated over time to provide an indication that e-beam scanning has occurred.

Figure 4:
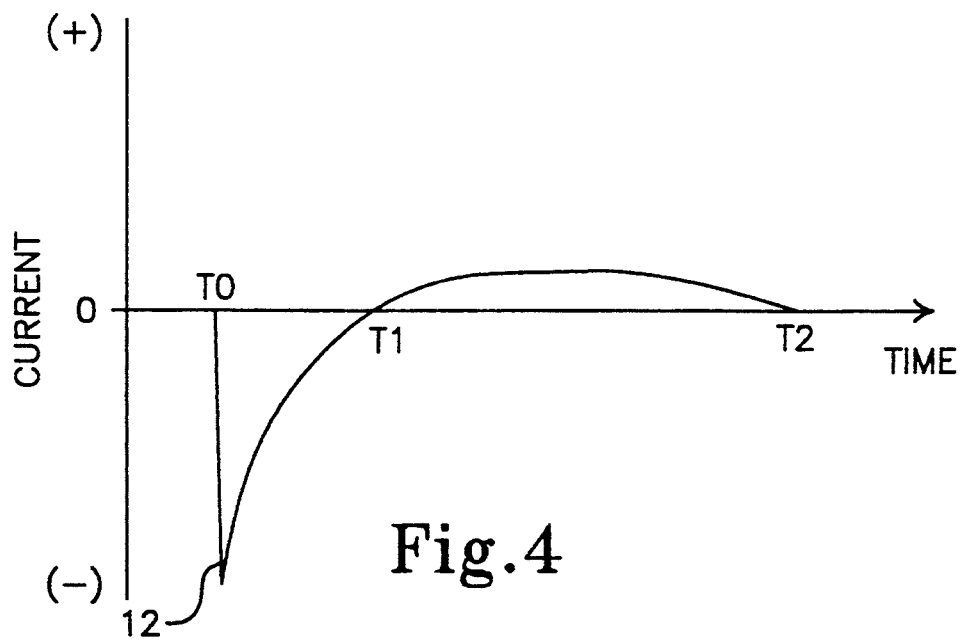

FIG. 3 shows the net charge accumulated over time as a function of beam energy. By contrast, the instantaneous current into or out of an electron collector plate at any given time is illustrated in FIG. 4. When an e-beam first strikes a detector plate at time T0, the injected electrons cause an instantaneous negative current pulse 12 to flow in the plate. As secondary electrons begin to be emitted, this negative current flow gradually diminishes and then reverses direction to become a positive flow at time T1. The positive current flow from the secondary electron emission reaches a peak, and then falls back to zero at time T2 when the emission of secondary electrons has been completed.

If the e-beam energy is tuned to level E2 (FIG. 3) such that no net positive or negative charge is accumulated, the area under the negative portion of the FIG. 4 current curve between T0 and T1 will be equal to and cancel the area under the positive portion of the curve between T1 and T2. In this situation, no e-beam detection based upon a net accumulated charge can be achieved. However, the invention also provides for the indication of e-beam scanning in response to the instantaneous current flow illustrated in FIG. 4 exceeding either a negative or a positive threshold level (after appropriate amplification). Thus, an indication that scanning has occurred will be produced if a net positive or negative charge is accumulated beyond a threshold level, regardless of the instantaneous current values, or if the instantaneous current values exceed positive or negative thresholds regardless of whether there is a net charge accumulation.

Figure 5:
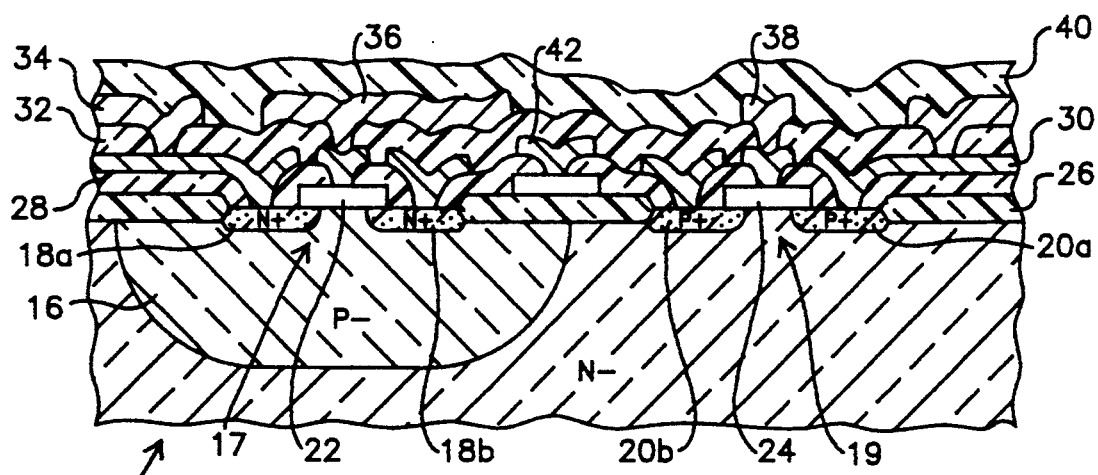
FIG. 5 is a sectional view of a portion of an IC substrate showing the fabrication of the e-beam scan detectors along with circuitry used to provide an indication that scanning has occurred.

FIG. 5 is a sectional view of an IC substrate 14 showing a pair of e-beam detector plates, and the initial portion of a circuit structure that responds to the plates being impacted by an e-beam to provide an appropriate indication. The substrate 14 is shown as being doped n−, with a p− well 16. Complementary metal oxide semiconductor CMOS FETs 17 and 19 are provided, consisting respectively of n+ drain and source regions 18a and 18b set in the p− well 16 and p+ drain and source regions 20a and 20b set in the n− substrate 14. Each device includes a channel region between its drain and source that is capped by a thin oxide gate layer about 300 Angstroms thick (not shown) under respective polysilicon layers 22 and 24. The transistor devices described thus far are of conventional design, and are separated by a field oxide insulating layer 26.

The described structure is capped by a deposited oxide insulating layer 28, followed by a first metallization layer 30 that extends through gaps in the deposited oxide insulating layer 28 to establish contacts with the gates, sources and drains of the FETs 17 and 19. An interlayer dielectric 32 separates the contacts of the first metallization layer from each other, and also provides insulation between the first metallization layer and a second metallization layer 34 formed over the first layer. The second metallization layer includes first and second e-beam detector plates 36 and 38 that are connected via the first metallization layer 30 to the gates of FETs 17 and 19, respectively. Plate 36 thus provides a charging to the gate of FET 17 in response to its being negatively or positively charged by a scanning e-beam, while plate 38 does the same for the gate of FET 19. Contacts to the FET sources and drains are also provided through the second metallization layer 34, in a conventional fashion. The structure is topped by a conventional overglass or passivation layer 40.

While e-beam detector plates 36 and 38 are shown in the same metallization layer, a detector plate could also be provided in the first metallization layer 28 or in any other metallization layers that may be used. Such an e-beam detector plate in the first metallization layer is indicated by numeral 42 in FIG. 5; it extends into the page for connection to the gate of its own FET (not shown).

Figure 6:
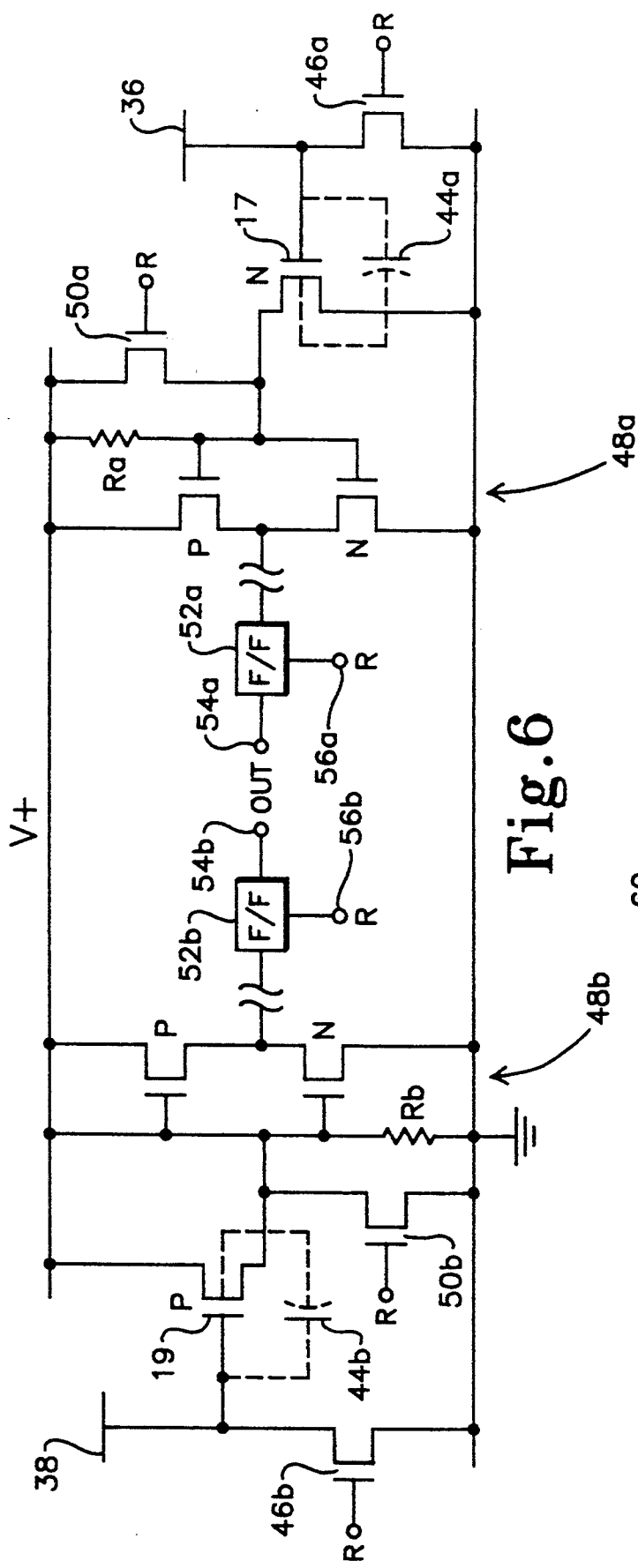
FIG. 6 is a schematic diagram of a detection circuit that uses the structure of FIG. 5.

FIG. 6 is a schematic diagram showing the connection of e-beam detector plates 36 and 38 into a circuit that produces an output to indicate when an e-beam scan has been detected. Plates 36 and 38 are shown connected to the gates of n-channel FET 17 and p-channel FET 19, as in FIG. 5. An inherent capacitance exists between the gate and channel of each FET, and is indicated in dashed lines by capacitors 44a and 44b for FETs 17 and 19, respectively. This capacitance accumulates the charge supplied over time from their respective electron collector plates, producing a capacitor charging that corresponds to the net positive or negative charge shown in FIG. 3 (ignoring a slow capacitance leakage). The sensitivities of the "floating gate" FETs 17 and 19 to accumulated charges can be regulated by the use of threshold shifting implants, and different detectors can have different thresholds if desired to provide a range of charged detection limits. When a positive charge threshold is exceeded for n-channel device 17, or a negative charge threshold is exceeded for p-channel device 19, the device will become conductive. This is used to drive one or more amplification stages, and eventually to set a digital logic element that provides an indication that e-beam scanning has been detected.

Reset FETs 46a and 46b are connected between ground and the gates of FETs 17 and 19, respectively. Reset signals are applied to the gates of devices 46a and 46b after an e-beam scan has been detected to render the devices conductive and thereby discharge the internal capacitances of detector FETs 17 and 19, in case they do not self-reset through internal linkage prior to the next e-beam scan detection.

The outputs of FETs 17 and 19 are connected to drive respective amplifier stages 48a and 48b. Various types of amplifiers could be employed, such as the invertor circuits shown in FIG. 6 in which complementary p-channel and n-channel FETs are connected in series between V+ and ground, with the outputs of the detector transistors 17 and 19 connected to the gate of each transistor in their respective amplifiers. Resistors Ra and Rb provide high impedance amplifier drain paths, while reset FETs 50a and 50b reset the gates of the amplifier transistors after an e-beam scan detection.

Additional amplifier stages (not shown) can be provided as desired, with the final stages for detector plates 36 and 38 connected respectively to latching devices such as flip-flop circuits 52a and 52b, respectively. The actuation of either flip-flop causes an output to be produced at a respective output terminal 54a or 54b to indicate that e-beam scanning has been detected. In response to such an output, the actuated flip-flop circuit is reset via a respective reset input 56a or 56b.

The output of the latch described above can be utilized in a variety of ways in connection with the circuit function of the IC in which the e-beam detection system resides. One method of utilizing the latch output at terminals 54a and 54b would be to modify the functional performance of the IC in real time.

If the substrate scanning is not continued for a significant period of time, the electrons injected into the detector plates (or the net positive charges produced as a result of secondary electron emission) may not be great enough to actuate the capacitance detection circuitry. However, the circuitry of FIG. 6 also responds to the instantaneous plate current produced by the beam and illustrated in FIG. 4. If the instantaneous positive current to the gate of FET 17 (from secondary electron emissions) or negative current to the gate of FET 19 (from primary electrons) exceed the threshold of either device, the device will momentarily conduct. The latching mechanism provided by the flip-flop circuits allows this instantaneous detection of an e-beam scan to be held as a continuous output.

Figure 7:
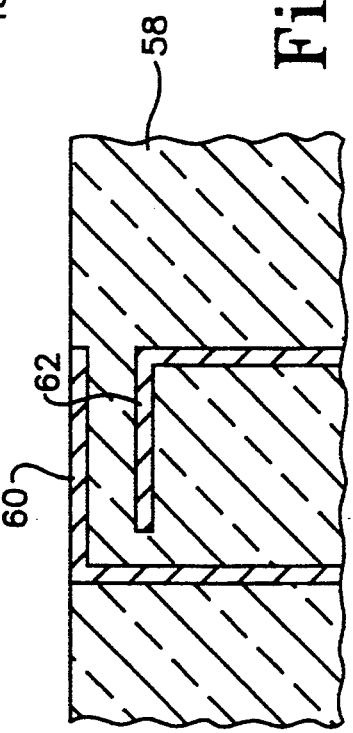
FIG. 7 is a sectional view illustrating another configuration of e-beam scan detectors that is based upon the differential between detectors at different levels within the substrate.

Since most digital ICs tend to be noisy due to a multiplicity of fast signal transitions, it is desirable that capacitive coupling into the detector be minimized. A detection scheme that accomplishes this, canceling common mode noise such as that injected from adjacent circuitry, makes use of detector plates at different depths within the substrate, with one plate providing a reference for the other. As illustrated in the portion of a substrate 58 shown in FIG. 7, the upper plate 60 is preferably positioned directly over the lower plate 62. This allows the upper plate to shade the lower plate from an e-beam scan, and thus ensure a true differential action. The two plates 60 and 62 are connected to the opposite inputs of a differential amplifier that can be realized using a CMOS operational amplifier structure, but is illustrated in simplified form in FIG. 8. The input differential amplifier FETs 64 and 66 have their sources connected together to supply current to a current source I1. Their gates are charged by detector plates 60 and 62, respectively, while the drain of FET 66 is connected to V+ and the drain FET 64 is connected through one or more amplifiers 68 to an output 70; this output can supply a signal to a latch as described above. With plate 62 fabricated immediately below plate 60, any adjacent circuitry will interact with both plates, and both plates will acquire essentially the same background noise. Since the differential amplifier scheme is based upon differences between the signals acquired by the two plates, the common noise is canceled as a potential source of false triggering, allowing the circuit to be triggered in response to an e-beam scanning over the upper plate 60.

Figures 8, 9:
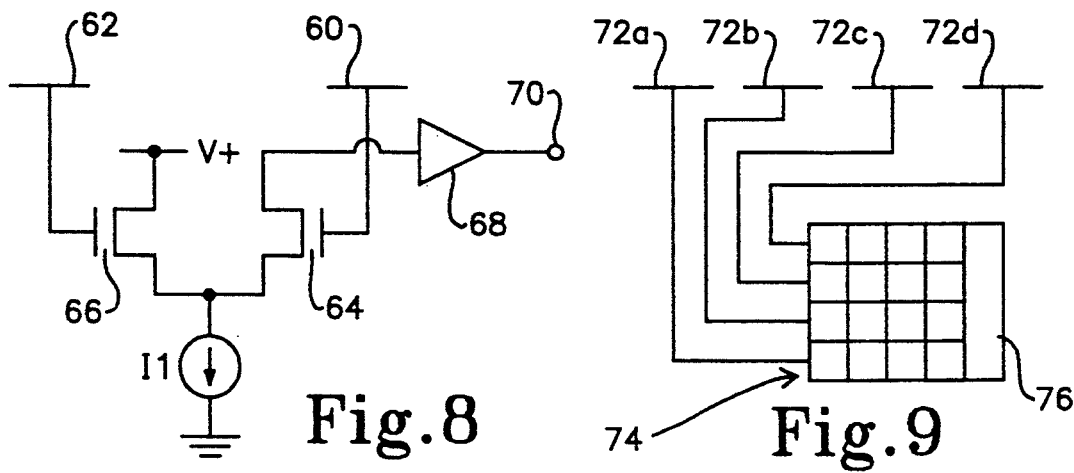
FIG. 8 is a schematic diagram of circuitry that can be used to provide an indication of e-beam scanning as detected by a differential detection scheme.
FIG. 9 is a block diagram of a CCD connected to accumulate the output of a plurality of e-beam scan detectors.

It is also possible to combine or accumulate the charge outputs from several plates to produce a single aggratate output, thereby increasing the sensitivity of the detection scheme without increasing the area of any of the individual plates. Such an approach is illustrated in FIG. 9, in which a plurality of detector plates 72a–72d are shown connected to the input cells of respective rows in a charge coupled device (CCD) 74. The charges acquired by the various input cells are clocked along from cell-to-cell in their respective rows, terminating in a summing cell 76 that accumulates the charges from each of the plates. The output of the summing cell 76 can then be used to trigger a charge-threshold device such as the FETs described above. While the use of a CCD summing arrangement would increase the e-beam detection sensitivity, careful control must be maintained on the nominal "zero" charge that resides in each cell, and the complexity of the control mechanism together with the need for multi-phase clocks might make this approach unduly complicated.

The invention makes it possible to detect an e-beam scan in a reliable fashion that does not use up an undue amount of chip area, provides a number of different detection mechanisms to enhance the likelihood of successful detection, and guards against false triggering from circuit noise. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An electrical circuit package, comprising:
    a substrate with an integrated circuit (IC) thereon,
    e-beam scan detecting means comprising at least one conductive member carried by the surface of said substrate for detecting the scanning of the substrate by an electron (e)-beam, said conductive member having a surface for receiving a scanning e-beam, at least one said conductive member being disposed below the surface of said substrate, and
    means responsive to the detection of e-beam scanning for indicating that e-beam scanning has occurred.

2. The electrical circuit package of claim 1, said substrate including an upper passivation layer, at least some of said conductive members being disposed below said passivation layer.

3. The electrical circuit package of claim 2, wherein a plurality of said conductive members are disposed at different depths below said passivation layer.

4. An electrical circuit package, comprising:
    a substrate with an integrated Circuit (IC) thereon,
    a mutually spaced plurality of e-beam scan detector means carried by said substrate for detecting the scanning of the substrate by an electron (e)-beam, and
    means responsive to the detection of e-beam scanning for indicating that e-beam scanning has occurred, wherein said means for producing an output is responsive to differences between the e-beam impacts detected by different scan detector means for producing said output, wherein said different detector means are located at different depths within said substrate.

5. The electrical circuit package of claim 4, wherein at least one of said different detector means is shaded from e-beam impacts by at least one other of said different detector means.

6. An electrical circuit package for detecting the scanning of a substrate by an electron (e)-beam, comprising:
    a plurality of mutually spaced conductive plates carried by said substrate,
    means for detecting charge applied to one or more of said plates from the scanning of said substrate by an e-beam in the vicinity of said plates, and means responsive to said detected charge exceeding a threshold level for producing an indication that e-beam scanning has occurred, said e-beam scan indicating means including a plurality of field effect transistors (FETs) having their source-drain circuits connected to initiate said indication, the gates of said FETs providing said charge detecting means by being connected to receive charge from respective plates in response to an e-beam being scanned over said plates, said e-beam scan indicating means including n-channel/p-channel FET pairs for respective pairs of plates, the gates of said FET pairs being connected together to receive charge from their respective plates, said FET pairs initiating an e-beam scan indication in response to the charge applied to their gates exceeding either a negative threshold associated with said p-channel FET or a positive threshold associated with said n-channel FET.

7. An electrical circuit package for detecting the scanning of a substrate by an electron (e)-beam, comprising:

a plurality of mutually spaced conductive plates carried by said substrate, means for detecting charge applied to one or more of said plates from the scanning of said substrate by an e-beam in the vicinity of said plates, and means responsive to said detected charge exceeding a threshold level for producing an indication by an e-beam scanning has occurred, wherein different plates are located at different depths within said substrate, and differential amplifier means are provided for respective pairs of plates at different depths to provide an e-beam scanning indication in response to the charges acquired by their respective plates differing by more than a threshold differential amount.

8. The electrical circuit package of claim 7, wherein one plate of a pair of plates is positioned to shade the other plate of said pair from said e-beam scanning.

* * * * *